(12) United States Patent
Huang et al.

(10) Patent No.: US 12,708,052 B2
(45) Date of Patent: Aug. 11, 2026

(54) DATA STORAGE DEVICE WITH LIGHT EMITTED MEMORY

(71) Applicant: Micron Technology, Inc., Boise, ID (US)

(72) Inventors: Chen Yu Huang, Taichung City (TW); Chong Leong Gan, Taichung City (TW)

(73) Assignee: Micron Technology, Inc., Boise, ID (US)

(*) Notice: Subject to any disclaimer, the term of this patent is extended or adjusted under 35 U.S.C. 154(b) by 111 days.

(21) Appl. No.: 18/775,315

(22) Filed: Jul. 17, 2024

(65) Prior Publication Data

US 2026/0026398 A1 Jan. 22, 2026

(51) Int. Cl.

| | |
|---|---|
| ***G11C 11/40*** | (2006.01) |
| ***G02B 6/42*** | (2006.01) |
| ***G11C 11/42*** | (2006.01) |
| ***H10B 63/00*** | (2023.01) |
| ***H10B 80/00*** | (2023.01) |
| ***H10H 20/857*** | (2025.01) |
| ***H10N 70/00*** | (2023.01) |
| ***H10N 79/00*** | (2023.01) |
| ***H10W 90/00*** | (2026.01) |

(52) U.S. Cl.

CPC ............ *H10W 90/00* (2026.01); *G02B 6/428* (2013.01); *G11C 11/42* (2013.01); *H10B 63/20* (2023.02); *H10B 80/00* (2023.02); *H10H 20/857* (2025.01); *H10N 70/881* (2023.02); *H10N 79/00* (2023.02)

(58) Field of Classification Search

CPC ....... H01L 25/167; G02B 6/428; G11C 11/42; H10B 63/20; H10B 80/00; H10H 20/857; H10N 70/881; H10N 79/00

See application file for complete search history.

(56) References Cited

U.S. PATENT DOCUMENTS

2011/0231618 A1* 9/2011 Baker ................ H04Q 11/0071 711/E12.001

OTHER PUBLICATIONS

Yen, Meng-Cheng, "All-inorganic perovskite quantum dot light-emitting memories", Nat Commun 12 1, (Jul. 22, 2021), 12 pages.

* cited by examiner

*Primary Examiner* — Xiaochun L Chen

(74) *Attorney, Agent, or Firm* — Schwegman Lundberg & Woessner, P.A.

(57) ABSTRACT

The present disclosure configures a system component, such as a memory sub-system controller, to control light emitted memory (LEM) devices. The controller receives, from a host, a request to perform one or more memory operations on a set of data. The controller transmits, via one or more optical waveguides, a command to the set of LEM devices to process the set of data based on the one or more memory operations.

20 Claims, 7 Drawing Sheets

DATA STORAGE DEVICE WITH LIGHT EMITTED MEMORY

TECHNICAL FIELD

Examples of the disclosure relate generally to memory sub-systems and, more specifically, to providing media management for memory components including light emitted memory (LEM).

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
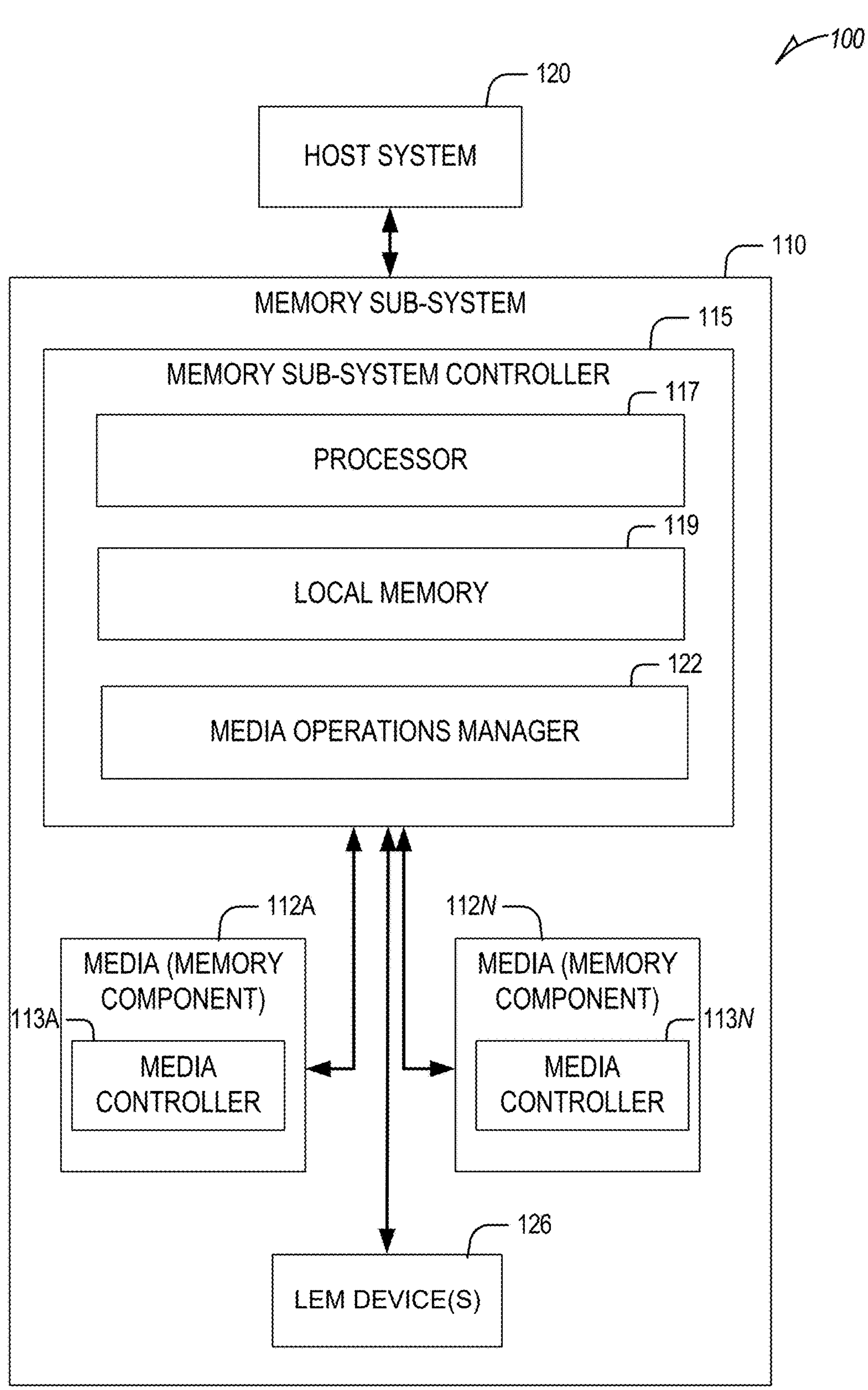
FIG. 1 is a block diagram illustrating an example computing environment including a memory sub-system, in accordance with some examples.

The present disclosure configures a system component, such as a memory sub-system controller, to perform memory operations (e.g., read, write, erase, and so forth) on a memory sub-system that includes a set of LEM devices. Specifically, the controller receives, from a host system, a request to perform one or more memory operations on a set of data. The controller transmits, via one or more optical waveguides, a command to the set of LEM devices to process the set of data based on the one or more memory operations. This enables the memory sub-system controller to satisfy host requests faster and more efficiently, which reduces the overall amount of resources needed to service read requests.

A memory sub-system can be a storage device, a memory module (memory component), or a hybrid of a storage device and memory module. Examples of storage devices and memory modules are described below in conjunction with FIG. 1. In general, a host system can utilize a memory sub-system that includes one or more memory components, such as memory devices (e.g., memory dies including LEM devices) that store data. The host system can send access requests (e.g., write command, read command) to the memory sub-system, such as to store data at the memory sub-system and to read data from the memory sub-system. The data (or set of data) specified by the host is hereinafter referred to as “host data,” “application data,” or “user data.”

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as “garbage collection data” and can be performed periodically for each block stripe (BS) that is stored in the memory sub-system. “User data” can include host data and garbage collection data. “System data” hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management (e.g., read disturb scan operations), different near miss error correction code (ECC), and/or different dynamic data refresh. Wear leveling ensures that all blocks in a memory component approach their defined erase-cycle budget at the same time, rather than some blocks approaching it earlier. Read disturb management counts all of the read operations to the memory component and if a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan, a refresh operation is triggered.

A memory device can be a non-volatile memory device. A non-volatile memory device is a package of one or more dice (or dies). Each die can be comprised of one or more planes. For some types of non-volatile memory devices (e.g., NOR- and (NAND) devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller and/or LEM devices. The memory devices can be managed memory devices (e.g., managed NAND), which are raw memory devices combined with a local embedded controller for memory management within the same memory device package.

There are challenges in efficiently managing or performing memory operations on the memory devices. These challenges present themselves as memory devices begin to store a greater amount of memory with a smaller amount of physical space. LEMs are a type of electronic device that combines memory storage capability with light emission functionality. These LEM devices integrate the properties of both memory storage (like RAM or flash memory) and light emission (similar to LEDs or OLEDs).

Integrating LEM devices with memory storage within a single device presents significant engineering challenges, such as ensuring compatibility between different technologies like OLEDs and non-volatile memory types (e.g., flash or MRAM). This integration complexity can lead to higher production costs due to the advanced materials and precision manufacturing processes needed, making LEM devices more expensive compared to traditional components. Additionally, ensuring the durability and reliability of both the memory and light-emitting components over time is an important aspect, as the device may need to withstand environmental factors such as temperature changes and physical wear without performance degradation. While LEMs offer potential energy savings and improved storage capacity, optimizing the energy efficiency of these devices remains a challenge, particularly in balancing the power requirements of memory and light-emitting functions to maximize battery life.

The present disclosure addresses the above and other deficiencies by providing a manufacturing process for a memory sub-system that includes a set of LEM devices and a memory controller that can operate such a memory sub-system. The disclosed controller can receive, from a host system, a request to perform one or more memory operations on a set of data. The disclosed controller can transmit, via one or more optical waveguides, a command to the set of LEM devices to process the set of data based on the one or more memory operations. This enables the memory sub-system controller to satisfy host requests faster and more efficiently, which reduces the overall amount of resources needed to service read requests.

LEMs can significantly enhance device design and functionality by offering space and material efficiency by reducing the physical space required for electronic components. This integration leads to more compact and potentially lighter devices, which is particularly valuable in portable and wearable technology. Improved device performance is another benefit, as storing state information directly where light is emitted facilitates faster response times and more dynamic control over display characteristics, thereby enhancing user experience in devices like smartphones and tablets. Additionally, LEMs contribute to energy conservation by reducing the need to continuously power separate memory and light-emitting components, which is a key advantage in battery-operated devices. Utilizing the disclosed techniques, a memory controller that operates LEM devices can leverage these advantages and enhancements.

In some examples, the disclosed techniques provide a set of memory components of a memory sub-system including a set of LEM devices and a processing device operatively coupled to the set of memory components via one or more electrical connections and one or more optical waveguides. The processing device can receive, from a host, a request to perform one or more memory operations on a set of data. The processing device can transmit, via the one or more optical waveguides, a command to the set of LEM devices to process the set of data based on the one or more memory operations.

The request to perform the one or more memory operations on the set of data can include a request to read the set of data. In such cases, the processing device can retrieve, from the set of LEM devices, the set of data and provide the retrieved set of data to the host. In some cases, the request to perform the one or more memory operations on the set of data includes a request to program the set of data. In such cases, the processing device can transmit an instruction to the set of LEM devices to store the set of data.

The set of LEM devices can include resistive random access memory (RRAM) and light emitting diodes (LEDs). The set of LEM devices process the set of data electrically and optically in parallel. The set of LEM devices can include a plurality of perovskite consisting of cesium lead bromide ($CsPbBr3$) devices. The RRAM electrically writes, erases, or reads the set of data in a first of the plurality of $CsPbBr3$ devices. A second of the plurality of $CsPbBr3$ devices optically transmits information indicating whether data is written or erased using light emission color and a light-emitting electrochemical cell.

In some examples, the set of LEM devices includes a first LEM device and a second LEM device. The first LEM device can be optically coupled to the second LEM device via the one or more waveguides. The one or more waveguides include a silicon/dielectric waveguide. The set of LEM devices and the one or more waveguides can be bonded using a chip-to-wafer hybrid bonding process to a printed circuit board (PCB) via a silicon photonics interposer. One or more fiber arrays can be coupled between the host and the processing device. The one or more fiber arrays can include the one or more optical waveguides.

The set of LEM devices can be placed on top of a PCB and can be coupled to the processing device and each other via the one or more optical waveguides that are integrated into the PCB. The PCB can include silicon (Si) with one or more etched cavities. In such cases, the set of LEM devices can be placed within the one or more etched cavities. The one or more optical waveguides can be coupled to the set of LEM devices via a top portion of the set of LEM devices. The top portion of the set of LEM devices can be on an opposite end of the set of LEM devices from a bottom portion of the set of LEM devices that is placed within the one or more etched cavities of the PCB. In some cases, the one or more etched cavities can be formed using at least one of photolithography, an etching process, or thin film deposition processes including at least one of: sputtering, chemical vapor deposition, or thermal oxidation.

In some examples, a method of manufacturing the memory sub-system is provided. The method can include placing a processing device on a first portion of a PCB including the memory sub-system. The method can include placing a set of memory components including a set of LEM devices on a second portion of the PCB. The method can include placing one or more fiber arrays on a third portion of the PCB. The method can include placing one or more electrical conductors on a fourth portion of the PCB. The method can include coupling the processing device to the set of memory components including the LEM devices via the one or more fiber arrays and the one or more electrical conductors.

Though various examples are described herein as being implemented with respect to a memory sub-system (e.g., a controller of the memory sub-system), some or all of the portions of an example can be implemented with respect to a host system, such as a software application or an operating system of the host system.

FIG. 1 illustrates an example computing environment 100 including a memory sub-system 110, in accordance with some examples. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies).

In some examples, the memory sub-system 110 is a storage system. A memory sub-system 110 can be a storage device, a memory module, or a hybrid of a storage device and memory module. Examples of a storage device include a SSD, a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some examples, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL), a USB interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe or CXL interface. The physical host interface can provide an interface for passing control, address, data, and other signals between the memory sub-system 110 and the host system 120.

The memory components 112A to 112N can include any combination of the different types of non-volatile memory components and/or volatile memory components and/or LEM device(s) 126. An example of non-volatile memory components includes NOR- and (NAND)-type flash memory. Each of the memory components 112A to 112N can include one or more arrays of memory cells such as single-level cells (SLCs) or multi-level cells (MLCs) (e.g., TLCs or QLCs). In some examples, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory.

In some examples, the memory components 112A to 112N can be, but are not limited to, RAM, read-only memory (ROM), dynamic random access memory (DRAM), synchronous dynamic random access memory (SDRAM), phase change memory (PCM), MRAM, (NOR) flash memory, electrically erasable programmable read-only memory (EEPROM), LEM device(s) 126, and/or a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages, word lines (WLs), planes, blocks, or sub-blocks that can refer to a unit of the memory component 112 used to store data. In general, the memory pages, WLs, sub-blocks, and/or blocks are collectively or individually referred to as memory components.

The memory sub-system controller 115 can communicate with the memory components 112A to 112N to perform operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management operations, such as read disturb scan operations, different near miss ECC operations, folding operations, preventing folding operations from being performed, and/or different dynamic data refresh operations.

The memory sub-system controller 115 can include hardware such as one or more integrated circuits and/or discrete components, one or more thermometers (used to measure a current operating temperature of the memory sub-system 110 and/or the memory components 112A to 112N or ambient temperature), a buffer memory, and/or a combination thereof. In some examples, the output of the one or more thermometers can be used to determine a current write temperature to be stored in association with data on the memory components 112A to 112N.

The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some examples, the local memory 119 can include memory registers storing memory pointers, fetched data, and so forth. The local memory 119 can also include ROM for storing microcode. While the example memory sub-system 110 in FIG. 1 has been illustrated as including the memory sub-system controller 115, in another example, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. In some examples, the commands or operations received from the host system 120 can specify configuration data for the memory components 112N to 112N.

The configuration data can specify which logical and/or physical addresses of the memory sub-system 110 to associate with light emitting storage cells (e.g., the LEM device(s) 126) and which to associate with electrical-based storage memory, such as NAND cells. Based on the configuration data, the memory sub-system controller 115 can selectively store data to either the LEM device(s) 126 or the NAND cells (e.g., the set of memory components 112A to 112N). In some cases, the LEM device(s) 126 can be physically part of the same physical component as the set of memory components 112A to 112N. In some cases, the LEM device(s) 126 are physically separate from the set of memory components 112A to 112N. The LEM device(s) 126 can be implemented on the same PCB as other types of electrical storage (e.g., NAND implemented on the set of memory components 112A to 112N) and, in other cases, the LEM device(s) 126 can be implemented on a separate PCB from other types of electrical storage (e.g., NAND implemented on the set of memory components 112A to 112N).

The memory sub-system controller 115 can be responsible for other memory management operations, such as wear leveling operations, garbage collection operations, error detection and ECC operations, encryption operations, caching operations, media scans (where different block stripes are read and analyzed for errors to determine whether to refresh or fold the block stripe), data refreshing, read disturb operations, and address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some examples, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), communicate with the memory sub-system controller 115, and execute memory requests (e.g., read or write) received from the memory sub-system controller 115.

For example, the memory sub-system 110 can include one or more waveguides (e.g., optical waveguides). The one or more waveguides can be used by the memory sub-system controller 115 to communicate with LEM device(s) 126. In some cases, the one or more waveguides can be used by the LEM device(s) 126 to communicate with each other. In some cases, a first portion of a memory block is stored on a first LEM device of the LEM device(s) 126 and a second portion of a same memory block (associated with the same logical block address (LBA)) is stored on a second LEM device of the LEM device(s) 126.

The memory sub-system controller 115 can include a media operations manager 122. The media operations manager 122 can be configured to control LEM device(s) 126 (e.g., a plurality of LEM devices). The media operations manager 122 can receive, from the host system 120, a request to perform one or more memory operations on a set of data (e.g., program the set of data, read the set of data from a certain set of memory addresses, and/or erase the set of data from a set of memory addresses). The media operations manager 122 transmits, via one or more optical waveguides (not shown), a command to the set of LEM device(s) 126 to process the set of data based on the one or more memory operations.

Depending on the examples, the media operations manager 122 can comprise logic (e.g., a set of transitory or non-transitory machine instructions, such as firmware) or one or more components that causes the media operations manager 122 to perform operations described herein. The media operations manager 122 can comprise a tangible or non-tangible unit capable of performing operations described herein. Further details with regards to the operations of the media operations manager 122 are described below.

Figure 2:
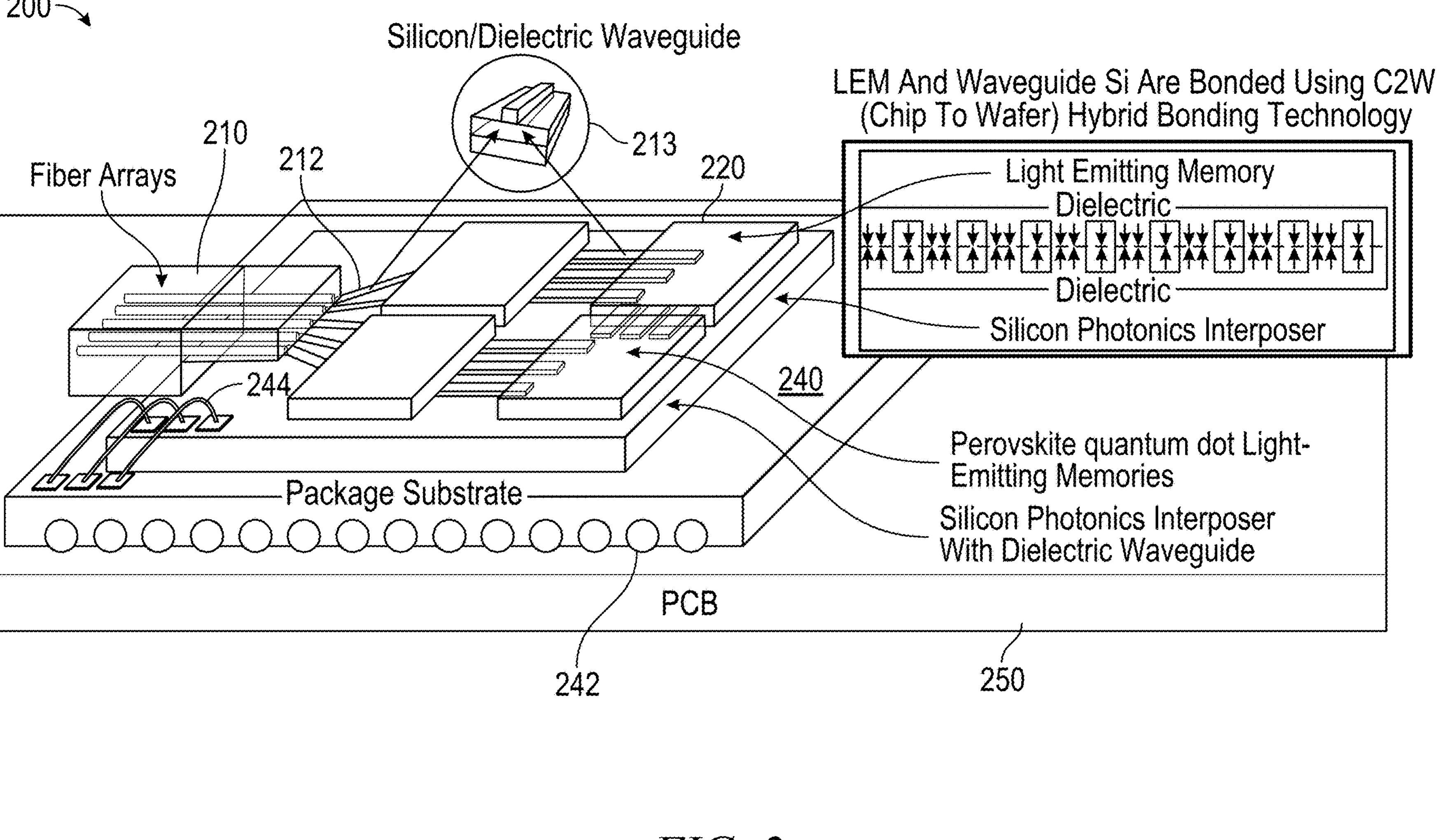
FIGS. 2-4 are block diagrams of a memory sub-system with a set of LEM devices, in accordance with some examples.
Figure 3:
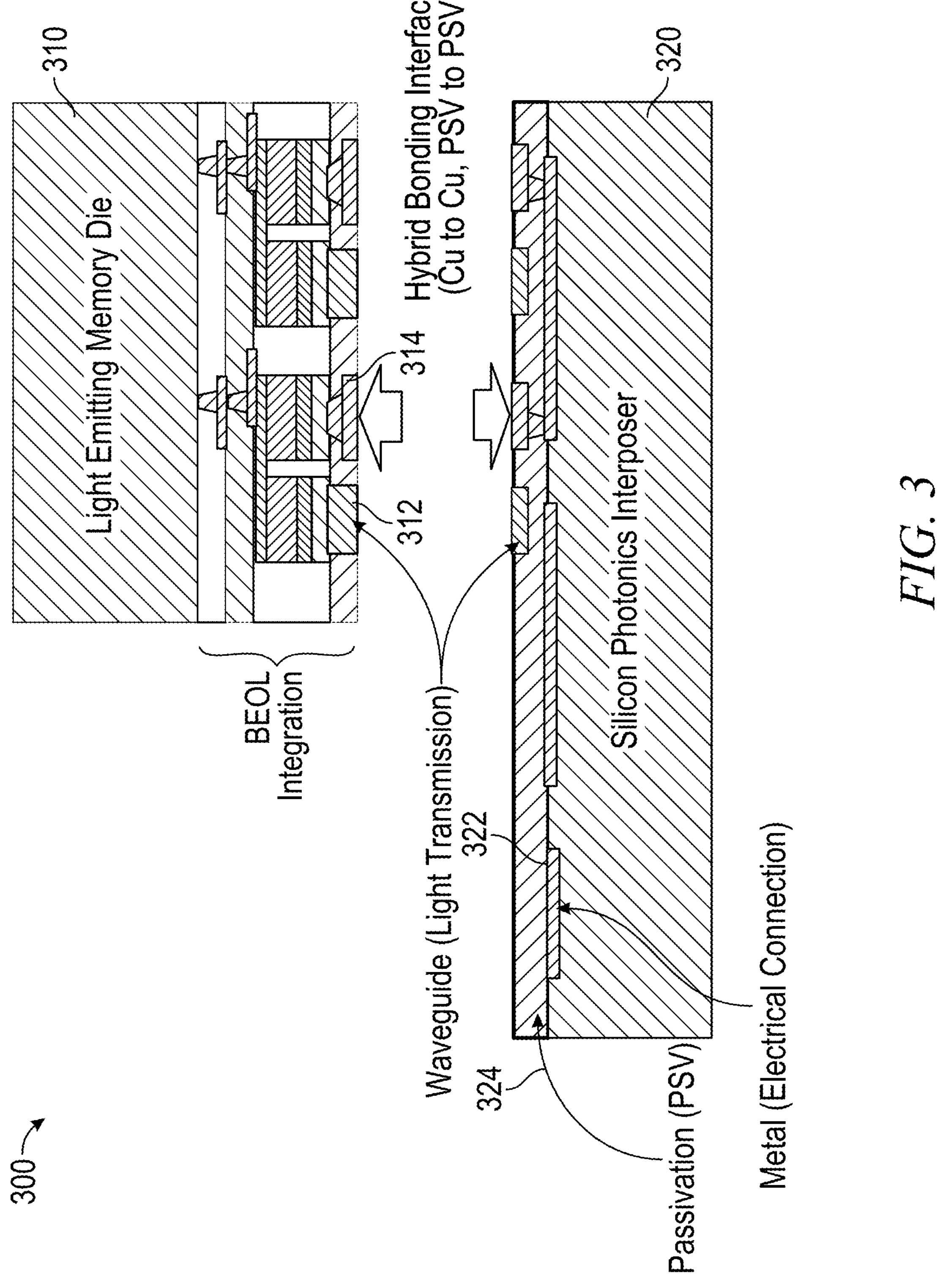
Figure 4:
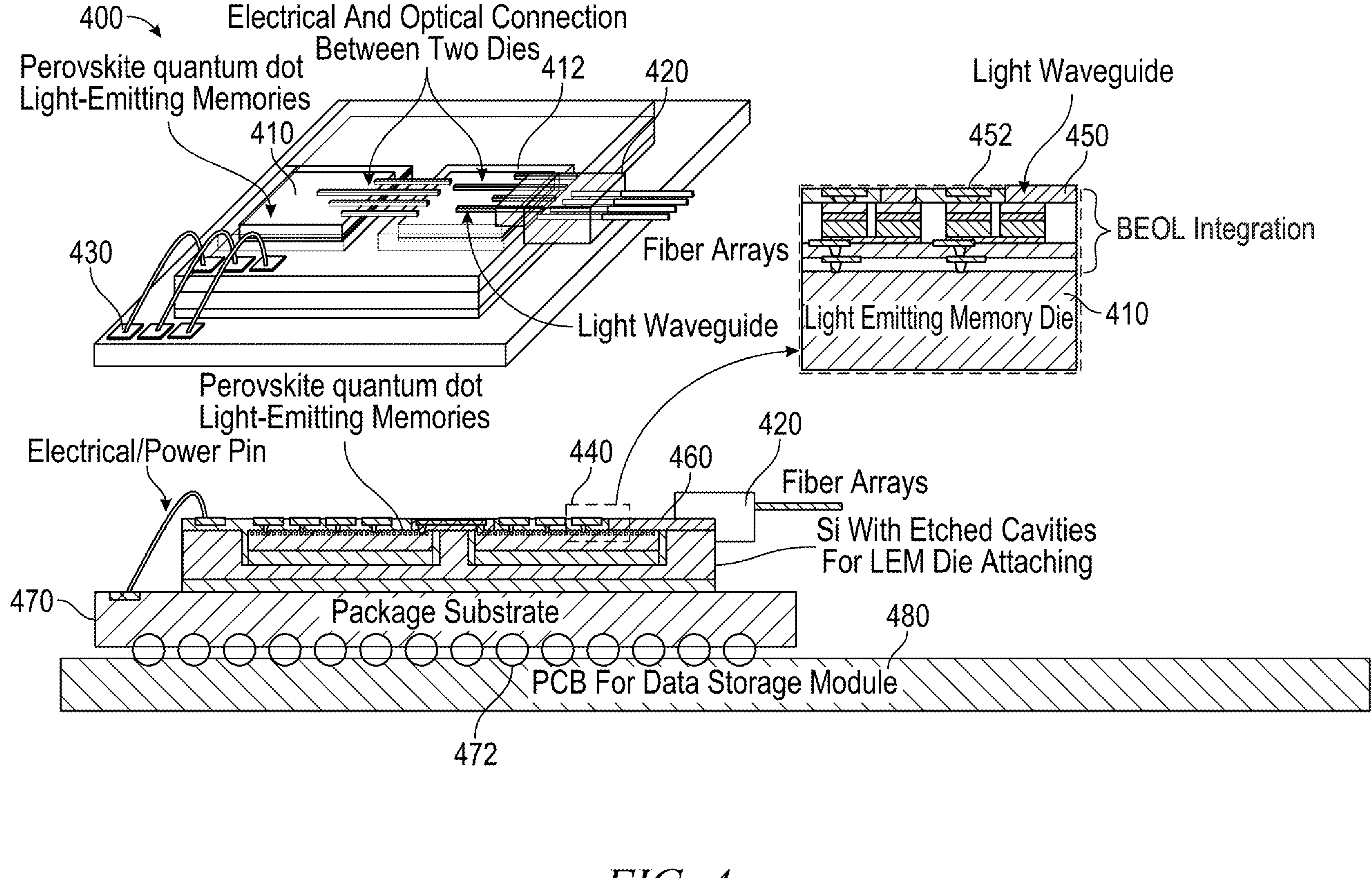

FIGS. 2-4 are block diagrams of the memory sub-system 110 with a set of LEM devices (e.g., LEM device(s) 126), in accordance with some examples. Specifically, as shown in the diagram 200, the memory sub-system 110 can include a PCB 250 coupled electrically and/or optically via a communication interface 242 (e.g., one or more pins) to a package substrate 240 on which a plurality of LEM devices 220 are implemented. One or more fiber arrays 210 (e.g., optical waveguides) can be implemented on the package substrate 240. The package substrate 240 can include one or more electrical connections 244 for delivering power and/or electrical signals to the one or more fiber arrays 210 and/or the plurality of LEM devices 220. The memory sub-system controller 115 can communicate with the plurality of LEM devices 220 via the communication interface 242 and the one or more fiber arrays 210 of the PCB 250. In some cases, the memory sub-system controller 115 is implemented as part of the package substrate 240.

In some examples, the plurality of LEM devices 220 are placed on the package substrate 240 via a silicon photonics interposer that includes a dielectric waveguide. For example, the silicon photonics interposer can include one or more optical waveguides 212. The one or more optical waveguides 212 can be used to couple the plurality of LEM devices 220 to each other and to the one or more fiber arrays 210. An example architecture 213 is shown to depict an illustrative implementation of the one or more optical waveguides 212.

In some cases, each plurality of LEM devices 220 is implemented using perovskite consisting of cesium lead bromide (CsPbBr3) devices. Each of the plurality of LEM devices 220 is bonded to the package substrate 240 via the silicon photonics interposer using a chip-to-wafer hybrid bonding process. As shown in diagram 200, the one or more optical waveguides 212 are coupled to the plurality of LEM devices 220 beneath or below each of the plurality of LEM devices 220. In such cases, the one or more optical waveguides 212 are placed between a bottom of the plurality of LEM devices 220 and a top portion of the package substrate 240. Additional electrical connections (not shown) can also be included within the package substrate 240 to couple the PCB 250 to each of the plurality of LEM devices 220.

The diagram 300 of FIG. 3 illustrates how an individual LEM device 310 of the plurality of LEM devices 220 is bonded through a passivation layer 324 and one or more metal electrical connections 322 to the silicon photonics interposer 320. The individual LEM device 310 includes an optical waveguide component 312 that is aligned vertically to overlap or be positioned on top of the optical waveguide of the passivation layer 324. Other electrical connections 314 can also be aligned to overlap the electrical connections 322 (e.g., wire bonds) of the passivation layer 324. The optical waveguide component 312 and the other electrical connections 314 along with other components can be included in the individual LEM device 310 through a back end of the line (BEOL) integration process.

The optical waveguide component 312 can include various types of waveguides including index-confined, profile-confined, diffused waveguides or combination thereof. The optical waveguide component 312 can include a channel waveguide or rib waveguide made of silicon, silicon-dioxide, LiNao, LiTao, III-V (GaAs), and/or polymer components. Specifically, the optical waveguide component 312 can incorporate various types of waveguides, with each tailored for specific optical properties and applications. These include index-confined, profile-confined, and diffused waveguides, which can be implemented either individually or in combination to optimize performance. Index-confined waveguides operate based on differences in the refractive index between the core and the cladding. This difference creates a boundary that effectively guides the light along the core by total internal reflection. Profile-confined waveguides, on the other hand, utilize variations in the geometric profile of the waveguide to control light propagation. This can include tapering or other modifications to the waveguide's cross-sectional area, which can influence the mode distribution and propagation characteristics of the light. Diffused waveguides are created by diffusing dopants into a substrate to alter its refractive index. This method is often used to fabricate waveguides on a variety of substrates, including those not traditionally used for optical applications, thereby offering flexibility in design and integration.

The optical waveguide component 312 can be structured as either a channel waveguide or a rib waveguide. Channel waveguides are fabricated by creating a strip of material that has a higher refractive index than its surroundings, effectively creating a channel that confines and guides light. Rib waveguides take this a step further by adding a "rib" structure on top of the channel, which helps in further confining the light in the vertical direction as well. Materials specified for these waveguides include silicon, silicon-dioxide, lithium niobate (LiNao), lithium tantalate (LiTao), III-V semiconductor materials like gallium arsenide (GaAs), and polymers. Each material brings distinct advantages. For instance, silicon is widely used in integrated optics due to its compatibility with existing semiconductor manufacturing processes. Silicon-dioxide provides excellent optical transparency and low loss, which is crucial for longer-distance optical transmission. Lithium niobate and lithium tantalate are known for their electro-optic properties, making them useful for modulators and switches. III-V semiconductors are used for their direct bandgap properties, which are essential in light-emitting applications. Polymers offer flexibility and case of processing, which can be advantageous in cost-sensitive or physically flexible applications. This diverse array of materials and waveguide types makes the optical waveguide component 312 highly adaptable, capable of being tailored to meet specific requirements of various high-performance optical systems.

The plurality of LEM devices 220 represent a sophisticated integration of light-emitting components, such as OLEDs, with advanced non-volatile memory technologies, including RRAM. RRAM is particularly advantageous for LEM applications due to its ability to store data by altering the resistance levels within a specialized material. This form of memory is non-volatile, meaning it does not require power to maintain the information stored within it. This characteristic is important for LEMs as it allows them to preserve specific light output settings (such as brightness, color, and pattern) even when the device is switched off.

In the operation of LEMs equipped with RRAM, the process begins with the user setting the desired light emission characteristics through a control interface, such as by storing configuration data. The RRAM component then records these settings by changing its material resistance to correspond with the data values of these settings. This data is encoded into the memory in a digital format, ensuring precision and reliability in how the settings are saved. When the LEM device is powered off, the RRAM retains this information without any power supply. Upon powering the device back on, the system accesses the RRAM to retrieve the stored settings. This data is then rapidly processed to adjust the light-emitting components to their previously configured states. This capability not only significantly enhances the user experience by providing instant light settings restoration but also promotes energy efficiency. The fast recall of settings eliminates the need for users to manually reconfigure their desired light outputs each time the device is used, thereby saving time and reducing energy consumption. This allows the plurality of LEM devices 220 to read data both electrically and optically in parallel and synchronously. Using perovskite consisting of cesium lead bromide (CsPbBr3), the data could be electrically written, erased, and read in one of the perovskite devices acting as an RRAM. Simultaneously, the second perovskite device can optically transmit whether data is written or erased through light emission color by working as a light-emitting electrochemical cell with a high transmission speed.

Moreover, the integration of RRAM in LEMs allows for more compact device designs. By combining memory and light emission functionalities into a single unit, manufacturers can reduce the number of components required, leading to slimmer and more lightweight devices. This integration is particularly beneficial in portable and wearable technologies, where space and power efficiency are paramount.

In some examples, as shown in the diagram 400 of FIG. 4, the optical and/or electrical components of the plurality of LEM devices 220 can be placed above the plurality of LEM devices 220 instead of beneath (as shown in diagram 300). Specifically, the diagram 400 shows a first LEM device 410 and a second LEM device 412 implemented on a PCB 480. The first LEM device 410 is optically coupled to the second LEM device 412 through a set of electrical and optical connections including an optical waveguide that are on top of the physical components in which the first LEM device 410 and second LEM device 412 are implemented. The set of electrical and optical connections are routed to fiber arrays 420 for delivering signals to the memory sub-system controller 115, such as through a package substrate communication interface 472. As shown, a package substrate 470 on which the first LEM device 410 and second LEM device 412 are implemented delivers electrical and/or power signals through a set of electrical connections 430 to the first LEM device 410 and second LEM device 412.

The first LEM device 410 (and similarly the second LEM device 412) can include one or more optical waveguides 450 and one or more electrical connections 452 through the BEOL integration process. As shown in diagram 400, the one or more optical waveguides 450 and one or more electrical connections 452 are placed on a top portion of the physical component that implements the first LEM device 410. The one or more optical waveguides 450 and one or more electrical connections 452 of the first LEM device 410 are coupled via respective optical waveguides 440 and electrical connections 460 to the fiber arrays 420. The optical waveguides 440 and electrical connections 460 are placed on a top portion of the first LEM device 410 opposite a bottom portion of the first LEM device 410 that is placed on top of or inside of the silicon photonics interposer 320.

In some examples, the silicon photonics interposer 320 includes an etched cavity inside of which the first LEM device 410 can be positioned and placed. This allows the top portion of the first LEM device 410 to be exposed and through which to couple the first LEM device 410 electrically and optically to the fiber arrays 420. The etched waveguide of silicon photonics interposer 320 can be formed using thin film deposition (e.g., sputtering, chemical vapor deposition, and/or thermal oxidation), photolithography, and/or any other suitable etching process.

Figure 5A:
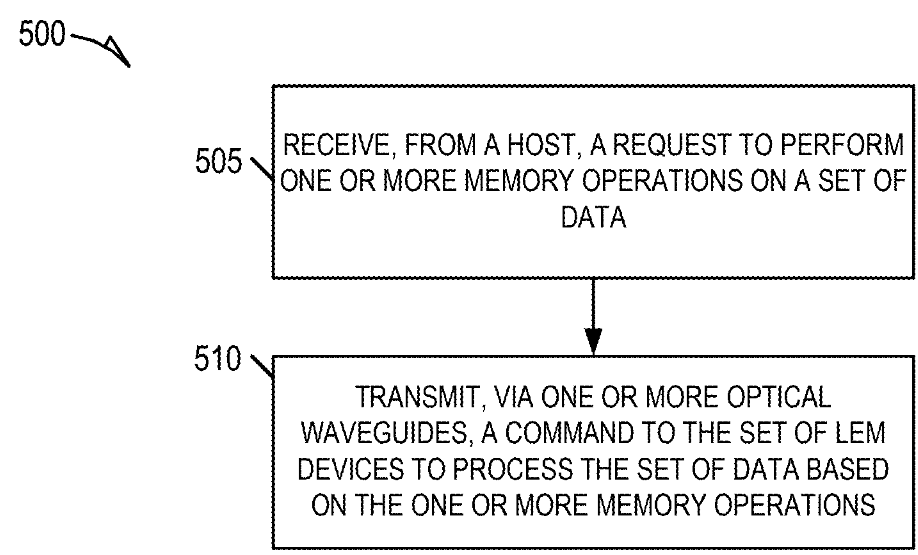
FIG. 5A is a flow diagram of an example method (or process) to operate a memory sub-system with a set of LEM devices, in accordance with some examples.

FIG. 5A is a flow diagram of an example method 500 to perform media management operations, in accordance with some examples. The method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 500 is performed by the media operations manager 122 of FIG. 1. Although the processes are shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

Referring now to FIG. 5A, the method (or process) 500 begins at operation 505 where the media operations manager 122 (e.g., the firmware of the memory sub-system 110) receives, from the host system 120, a request to perform one or more memory operations on a set of data. The media operations manager 122, at operation 510, transmits, via the one or more optical waveguides, a command to the LEM device(s) 126 to process the set of data based on the one or more memory operations.

Figure 5B:
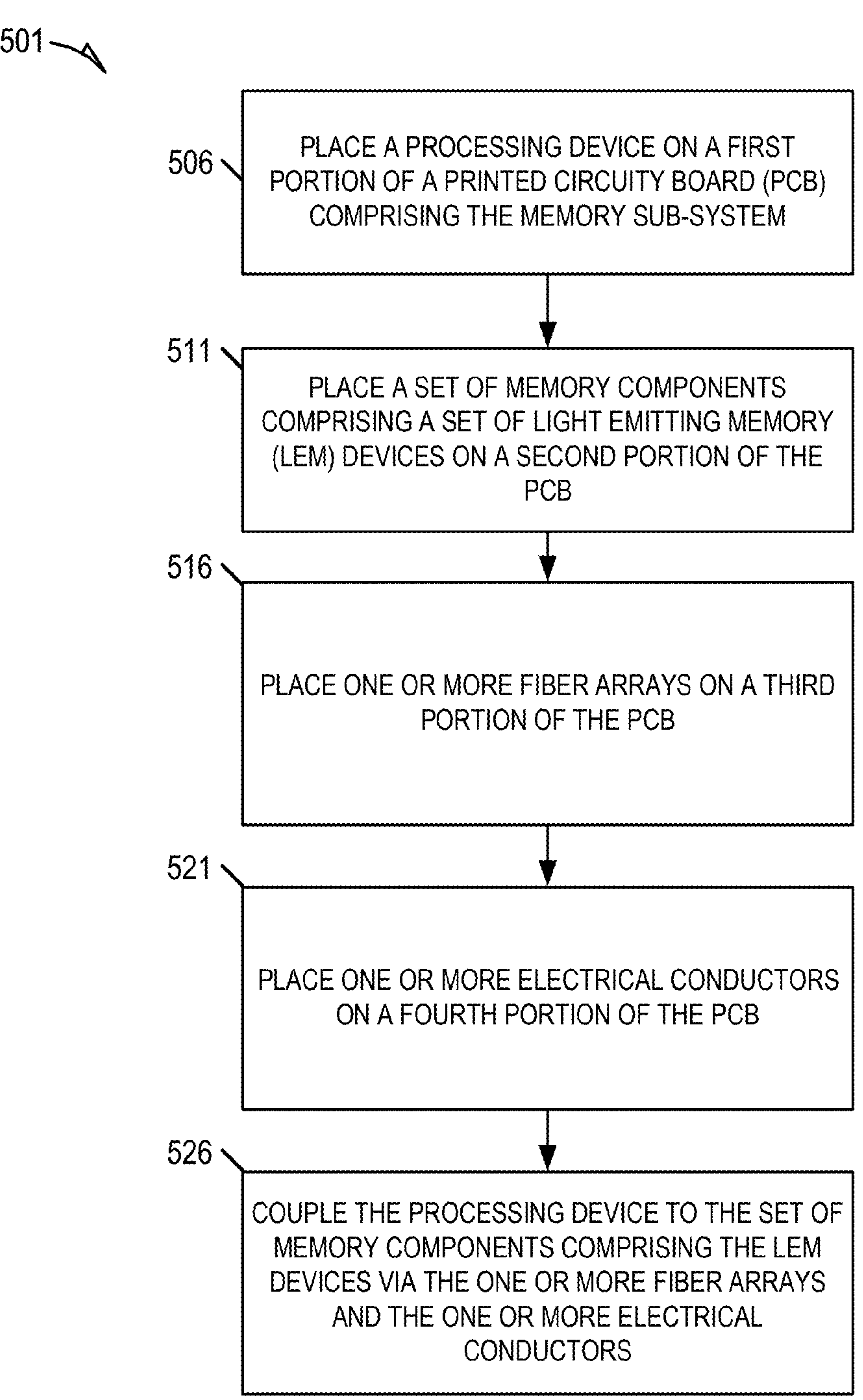
FIG. 5B is a flow diagram of an example method (or process) to manufacture a memory sub-system with a set of LEM devices, in accordance with some examples.

FIG. 5B is a flow diagram of an example method 501 to perform media management operations, in accordance with some examples. The method 501 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 501 is performed by the media operations manager 122 of FIG. 1. Although the processes are shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

Referring now to FIG. 5B, the method (or process) 501 begins at operation 506 with a processing device (e.g., the memory sub-system controller 115) placed on a first portion of a PCB that includes the memory sub-system 110. Then, at operation 511, a set of memory components 112A to 112N (including the LEM device(s) 126) is placed on a second portion of the PCB along with one or more fiber arrays being placed on a third portion of the PCB at operation 516. At operation 521, one or more electrical conductors are placed on a fourth portion of the PCB. The processing device is coupled to the set of memory components 112A to 112N including the LEM device(s) 126 via the one or more fiber arrays and the one or more electrical conductors at operation 526.

In view of the disclosure above, various examples are set forth below. It should be noted that one or more features of an example, taken in isolation or combination, should be considered within the disclosure of this application.

Example 1. A system comprising: a set of memory components of a memory sub-system, the set of memory components comprising a set of light emitting memory (LEM) devices; and a processing device operatively coupled to the set of memory components via one or more electrical connections and one or more optical waveguides, the processing device being configured to perform operations comprising: receiving, from a host, a request to perform one or more memory operations on a set of data; and transmitting, via the one or more optical waveguides, a command to the set of LEM devices to process the set of data based on the one or more memory operations.

Example 2. The system of Example 1, wherein the request to perform the one or more memory operations on the set of data comprises a request to read the set of data, the operations comprising: retrieving, from the set of LEM devices, the set of data; and providing the set of data retrieved from the set of LEM devices to the host.

Example 3. The system of any one of Examples 1-2, wherein the request to perform the one or more memory operations on the set of data comprises a request to program the set of data, the operations comprising: transmitting an instruction to the set of LEM devices to store the set of data.

Example 4. The system of any one of Examples 1-3, wherein the set of LEM devices comprise resistive random access memory (RRAM) and light emitting diodes (LEDs).

Example 5. The system of Example 4, wherein the set of LEM devices process the set of data electrically and optically in parallel.

Example 6. The system of Example 5, wherein the set of LEM devices comprise a plurality of perovskite consisting of cesium lead bromide ($CsPbBr_3$) devices.

Example 7. The system of Example 6, wherein the RRAM electrically writes, erases, or reads the set of data in a first of the plurality of $CsPbBr_3$ devices.

Example 8. The system of Example 7, wherein a second of the plurality of $CsPbBr_3$ devices optically transmits information indicating whether data is written or erased using light emission color and a light-emitting electrochemical cell.

Example 9. The system of any one of Examples 1-8, wherein the set of LEM devices comprises a first LEM device and a second LEM device, wherein the first LEM device is optically coupled to the second LEM device via the one or more waveguides.

Example 10. The system of Example 9, wherein the one or more waveguides comprise a silicon/dielectric waveguide.

Example 11. The system of Example 10, wherein the set of LEM devices and the one or more waveguides are bonded using a chip-to-wafer hybrid bonding process to a printed circuit board (PCB) via a silicon photonics interposer.

Example 12. The system of any one of Examples 1-11, comprising one or more fiber arrays coupled between the host and the processing device, the one or more fiber arrays comprising the one or more optical waveguides.

Example 13. The system of Example 12, wherein the set of LEM devices are placed on top of a (PCB and are coupled to the processing device and each other via the one or more optical waveguides that are integrated into the PCB.

Example 14. The system of any one of Examples 12-13, wherein a PCB comprises silicon (Si) with one or more etched cavities, wherein the set of LEM devices are placed within the one or more etched cavities.

Example 15. The system of Example 14, wherein the one or more optical waveguides are coupled to the set of LEM devices via a top portion of the set of LEM devices, the top portion of the set of LEM devices being on an opposite end of the set of LEM devices from a bottom portion of the set of LEM devices that is placed within the one or more etched cavities of the PCB.

Example 16. The system of any one of Examples 14-15, wherein the one or more etched cavities are formed using at least one of photolithography, an etching process, or thin film deposition processes comprising at least one of: sputtering, chemical vapor deposition, or thermal oxidation.

Example 17. A method comprising: receiving, from a host, a request to perform one or more memory operations on a set of data; and transmitting, via one or more optical waveguides, a command to a set of LEM devices to process the set of data based on the one or more memory operations.

Example 18. The method of Example 17, wherein the set of LEM devices comprises a first LEM device and a second LEM device, wherein the first LEM device is optically coupled to the second LEM device via the one or more waveguides.

Example 19. The method of any one of Examples 17-18, wherein the one or more waveguides comprise a silicon/dielectric waveguide.

Example 20. A method of manufacturing a memory sub-system, the method comprising: placing a processing device on a first portion of a printed circuit board (PCB) comprising the memory sub-system; placing a set of memory components comprising a set of light emitting memory (LEM) devices on a second portion of the PCB; placing one or more fiber arrays on a third portion of the PCB; placing one or more electrical conductors on a fourth portion of the PCB; and coupling the processing device to the set of memory components comprising the LEM devices via the one or more fiber arrays and the one or more electrical conductors.

Methods and computer-readable storage medium with instructions for performing any one of the above Examples.

Figure 6:
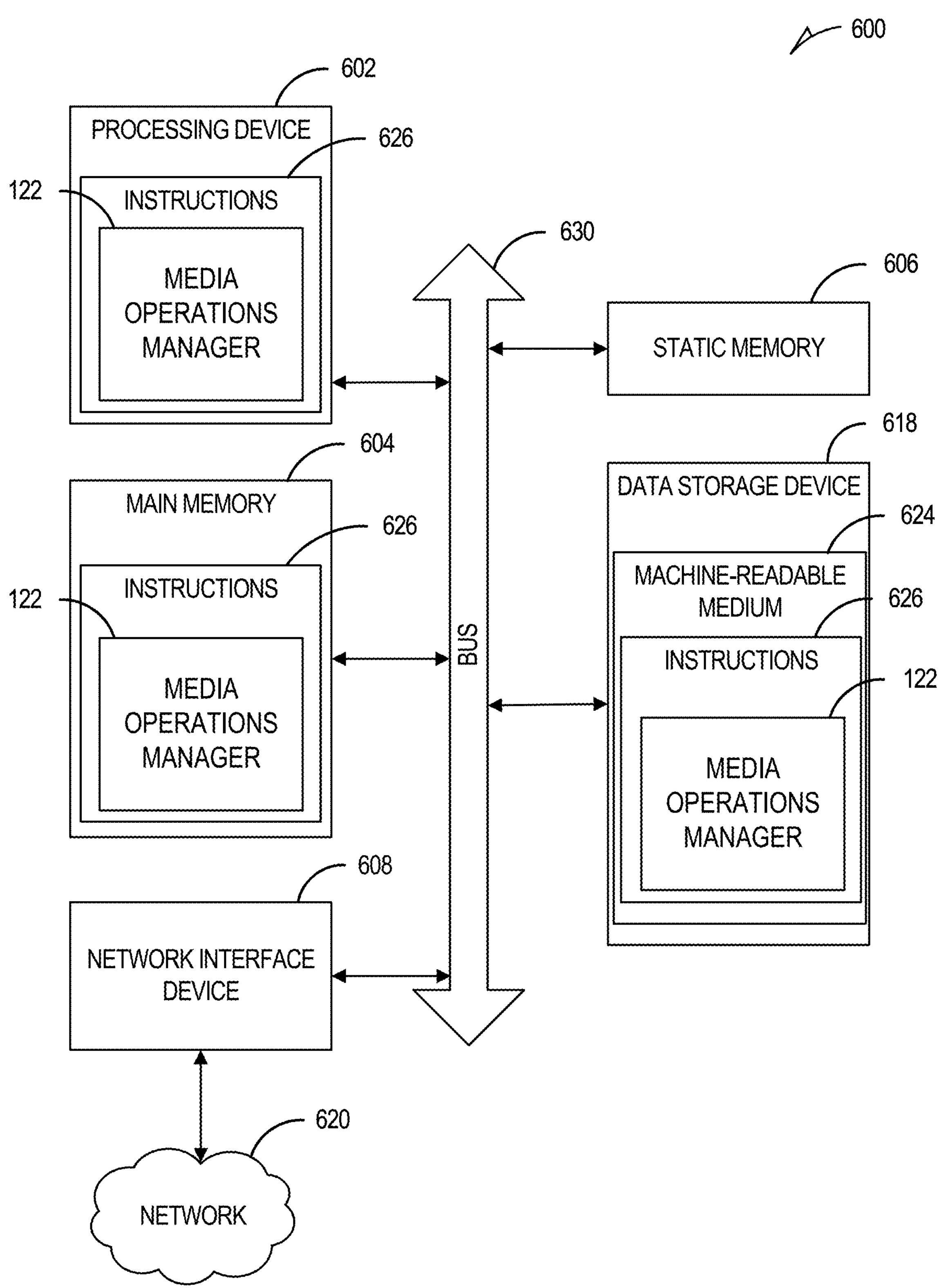
FIG. 6 is a block diagram illustrating a diagrammatic representation of a machine in the form of a computer system within which a set of instructions can be executed for causing the machine to perform any one or more of the methodologies discussed herein, in accordance with some examples.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media operations manager 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or RDRAM, etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an ASIC, a FPGA, a digital signal processor (DSP), a network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 implement functionality corresponding to the media operations manager 122 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; ROMs; RAMs; erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a ROM, RAM, magnetic disk storage media, optical storage media, flash memory components, and so forth.

In the foregoing specification, examples of the disclosure have been described with reference to specific example embodiments thereof. It will be evident that various modifications can be made thereto without departing from the broader examples of the disclosure as set forth in the following claims. The specification and drawings are, accordingly, to be regarded in an illustrative sense rather than a restrictive sense.

What is claimed is:

1. A system comprising:

a set of memory components of a memory sub-system, the set of memory components comprising a set of light emitting memory (LEM) devices, the set of LEM devices comprising light emitting diodes (LEDs), and each LEM device of the set of LEM devices comprising an integrated waveguide configured for light transmission; and a processing device operatively coupled to the set of memory components via one or more electrical connections and one or more optical waveguides, the one or more optical waveguides being optically coupled to the integrated waveguide of each LEM device to enable optical communication for exchanging data to be read from or stored to the set of LEM devices, the set of LEM devices comprising a first LEM device and a second LEM device, the first LEM device being optically coupled to the second LEM device via the one or more waveguides, the processing device being programmed to perform operations comprising:

receiving, from a host, a request to perform one or more memory operations on a set of data; and transmitting, via the one or more optical waveguides, a command to the set of LEM devices to perform the one or more operations on the set of data.

2. The system of claim 1, wherein the request to perform the one or more memory operations on the set of data comprises a request to read the set of data, the operations comprising:

retrieving, from the set of LEM devices, the set of data; and providing the set of data retrieved from the set of LEM devices to the host.

3. The system of claim 1, wherein the request to perform the one or more memory operations on the set of data comprises a request to program the set of data, the operations comprising:

transmitting an instruction to the set of LEM devices to store the set of data.

4. The system of claim 1, wherein the set of LEM devices comprise resistive random access memory (RRAM).

5. The system of claim 4, wherein the set of LEM devices process the set of data electrically and optically in parallel.

6. The system of claim 5, wherein the set of LEM devices comprise a plurality of perovskite consisting of cesium lead bromide (CsPbBr3) devices.

7. The system of claim 6, wherein the RRAM electrically writes, erases, or reads the set of data in a first of the plurality of CsPbBr3 devices.

8. The system of claim 7, wherein a second of the plurality of CsPbBr3 devices optically transmits information indicating whether data is written or erased using light emission color and a light-emitting electrochemical cell.

9. The system of claim 1, wherein the one or more waveguides comprise a silicon/dielectric waveguide.

10. The system of claim 9, wherein the set of LEM devices and the one or more waveguides are bonded using a chip-to-wafer hybrid bonding process to a printed circuit board (PCB) via a silicon photonics interposer.

11. The system of claim 1, comprising one or more fiber arrays coupled between the host and the processing device, the one or more fiber arrays comprising the one or more optical waveguides.

12. The system of claim 11, wherein the set of LEM devices are placed on top of a printed circuit board (PCB) and are coupled to the processing device and each other via the one or more optical waveguides that are integrated into the PCB.

13. The system of claim 11, wherein a printed circuit board (PCB) comprises silicon (Si) with one or more etched cavities, wherein the set of LEM devices are placed within the one or more etched cavities.

14. The system of claim 13, wherein the one or more optical waveguides are coupled to the set of LEM devices via a top portion of the set of LEM devices, the top portion of the set of LEM devices being on an opposite end of the set of LEM devices from a bottom portion of the set of LEM devices that is placed within the one or more etched cavities of the PCB.

15. The system of claim 13, wherein the one or more etched cavities are formed using at least one of photolithography, an etching process, or thin film deposition processes comprising at least one of: sputtering, chemical vapor deposition, or thermal oxidation.

16. A method comprising:

receiving, from a host, a request to perform one or more memory operations on a set of data; and transmitting, via one or more optical waveguides, a command to a set of light emitting memory (LEM) devices to perform the one or more memory operations on the set of data, the set of LEM devices comprising light emitting diodes (LEDs), each LEM device of the set of LEM devices comprising an integrated waveguide configured for light transmission, the one or more optical waveguides being optically coupled to the integrated waveguide of each LEM device to enable optical communication for exchanging data to be read from or stored to the set of LEM devices, the set of LEM devices comprising a first LEM device and a second LEM device, the first LEM device being optically coupled to the second LEM device via the one or more optical waveguides.

17. The method of claim 16, wherein the one or more waveguides comprise a silicon/dielectric waveguide.

18. A method of manufacturing a memory sub-system, the method comprising:

placing a processing device on a first portion of a printed circuit board (PCB) comprising the memory sub-system;

placing a set of memory components comprising a set of light emitting memory (LEM) devices on a second portion of the PCB, the set of LEM devices comprising light emitting diodes (LEDs), each LEM device of the set of LEM devices comprising an integrated waveguide configured for light transmission, the set of LEM devices comprising a first LEM device and a second LEM device;

placing one or more fiber arrays comprising one or more optical waveguides on a third portion of the PCB;

placing one or more electrical conductors on a fourth portion of the PCB; and coupling the processing device to the set of memory components comprising the LEM devices via the one or more fiber arrays and the one or more electrical conductors, the one or more optical waveguides being optically coupled to the integrated waveguide of each LEM device to enable optical communication for exchanging data to be read from or stored to the set of LEM devices, and the first LEM device being optically coupled to the second LEM device via the one or more optical waveguides.

19. The method of claim 18, wherein the one or more waveguides comprise a silicon/dielectric waveguide.

20. The method of claim 19, wherein the set of LEM devices and the one or more waveguides are bonded using a chip-to-wafer hybrid bonding process to a printed circuit board (PCB) via a silicon photonics interposer.

* * * * *